(12) United States Patent
Nagakubo et al.

(10) Patent No.: US 10,658,150 B2
(45) Date of Patent: May 19, 2020

(54) CRYOSTATION SYSTEM

(71) Applicant: Hitachi High-Technologies Corporation, Minato-ku, Tokyo (JP)

(72) Inventors: Yasuhira Nagakubo, Tokyo (JP); Toshiyuki Iwahori, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 144 days.

(21) Appl. No.: 15/129,990

(22) PCT Filed: Apr. 2, 2015

(86) PCT No.: PCT/JP2015/060525
§ 371 (c)(1),
(2) Date: Sep. 28, 2016

(87) PCT Pub. No.: WO2015/152385
PCT Pub. Date: Oct. 8, 2015

(65) Prior Publication Data
US 2017/0213693 A1    Jul. 27, 2017

(30) Foreign Application Priority Data
Apr. 3, 2014  (JP) ................. 2014-076620

(51) Int. Cl.
*H01J 37/20*   (2006.01)
*G01N 1/42*   (2006.01)
(Continued)

(52) U.S. Cl.
CPC ................ *H01J 37/20* (2013.01); *B01L 7/04* (2013.01); *B01L 7/50* (2013.01); *F25D 3/10* (2013.01);
(Continued)

(58) Field of Classification Search
USPC .......................................................... 62/275
See application file for complete search history.

(56) References Cited

U.S. PATENT DOCUMENTS

| 4,302,950 A | 12/1981 | Sitte | |
| 4,637,226 A * | 1/1987 | Sitte | ......................... F17C 9/00 62/51.1 |

(Continued)

FOREIGN PATENT DOCUMENTS

| CN | 2032598 U | 2/1989 |
| CN | 1032073 A | 3/1989 |

(Continued)

OTHER PUBLICATIONS

Translation JP 11-63761 A.*
(Continued)

*Primary Examiner* — Henry T Crenshaw
(74) *Attorney, Agent, or Firm* — Crowell & Moring LLP

(57) ABSTRACT

The present invention stores a cooled sample subjected to freezing treatment, or the like, while preventing the formation of condensation and frost-like substances and loads the sample into a sample holder for observation using a charged particle beam device. The present invention is provided with a main body for storing a sample and a lid unit mounted above the main body and is characterized in that the main body is divided into a first space and a second space by a partition member; the first space accommodates a cooling medium for cooling the sample; the second space has, disposed therein, a heating unit for heating the cooling medium accommodated in the first space; and the lid unit has, formed therein, a discharge port for discharging the gas generated by the heating of the cooling medium to the outside.

9 Claims, 14 Drawing Sheets

(51) Int. Cl.
*B01L 7/04* (2010.01)
*B01L 7/00* (2006.01)
*F25D 3/10* (2006.01)
*G01N 1/28* (2006.01)
*F25D 21/04* (2006.01)

(52) U.S. Cl.
CPC ............ *F25D 3/102* (2013.01); *F25D 3/105* (2013.01); *F25D 21/04* (2013.01); *G01N 1/28* (2013.01); *G01N 1/42* (2013.01); *B01L 2200/0684* (2013.01); *B01L 2300/185* (2013.01); *H01J 2237/2001* (2013.01); *H01J 2237/2002* (2013.01); *H01J 2237/204* (2013.01); *H01J 2237/20214* (2013.01); *H01J 2237/20235* (2013.01)

(56) References Cited

U.S. PATENT DOCUMENTS

| | | | | |
|---|---|---|---|---|
| 4,723,420 | A | | 2/1988 | Sitte |
| 4,739,622 | A | * | 4/1988 | Smith .................. F17C 13/026 62/216 |
| 4,888,956 | A | | 12/1989 | le Roux Murray |
| 5,753,924 | A | * | 5/1998 | Swann .................... H01J 37/20 250/440.11 |
| 5,779,089 | A | * | 7/1998 | West ........................ F17C 3/02 220/203.11 |
| 2011/0027876 | A1 | * | 2/2011 | Lihl ........................ G01N 1/42 435/307.1 |
| 2012/0112064 | A1 | * | 5/2012 | Nagakubo .............. G01N 1/286 250/307 |
| 2012/0305769 | A1 | * | 12/2012 | Yaguchi .................. H01J 37/20 250/310 |
| 2015/0340199 | A1 | | 11/2015 | Nagakubo et al. |

FOREIGN PATENT DOCUMENTS

| | | | |
|---|---|---|---|
| CN | 2550699 Y | 5/2003 | |
| CN | 101568727 A | 10/2009 | |
| CN | 201321475 Y | 10/2009 | |
| JP | 61-40538 A | 2/1986 | |
| JP | 63-143478 A | 6/1988 | |
| JP | 11-63761 A * | 3/1999 | ............... F25D 3/10 |
| JP | 2010-8141 A | 1/2010 | |
| JP | 2010-257617 A | 11/2010 | |
| JP | 2013-88328 A | 5/2013 | |
| JP | 2014-10965 A | 1/2014 | |
| WO | WO 2014/002700 A1 | 1/2014 | |

OTHER PUBLICATIONS

Translation JP 11-63761 A (Year: 1999).*
International Preliminary Report on Patentability (PCT/IB/338 & PCT/IB/373) issued in PCT Application No. PCT/JP2015/060525 dated Oct. 13, 2016, (Japanese-language Written Opinion (PCT/ISA/237)) previously filed on Sep. 28, 2016 (ten (10) pages).
Japanese-language Office Action issued in counterpart Japanese Application No. 2016-512005 dated Jul. 25, 2017 with English translation (Eight (8) pages).
International Search Report (PCT/ISA/210) issued in PCT Application No. PCT/JP2015/060525 dated Jun. 9, 2015 with English-language translation (five (5) pages).
Japanese-language Written Opinion (PCT/ISA/237) issued in PCT Application No. PCT/JP2015/060525 dated Jun. 9, 2015 (six (6) pages).
Chinese-language Office Action issued in counterpart Chinese Application No. 201580014843.X dated May 23, 2018 with English translation (13 pages).
Chinese-language Office Action issued in counterpart Chinese Application No. 201580014843.X dated Nov. 21, 2018 with English translation (13 pages).
Chinese-language Office Action issued in counterpart Chinese Application No. 201580014843.X dated May 24, 2019 with English translation (14 pages).

* cited by examiner

[FIG. 1]
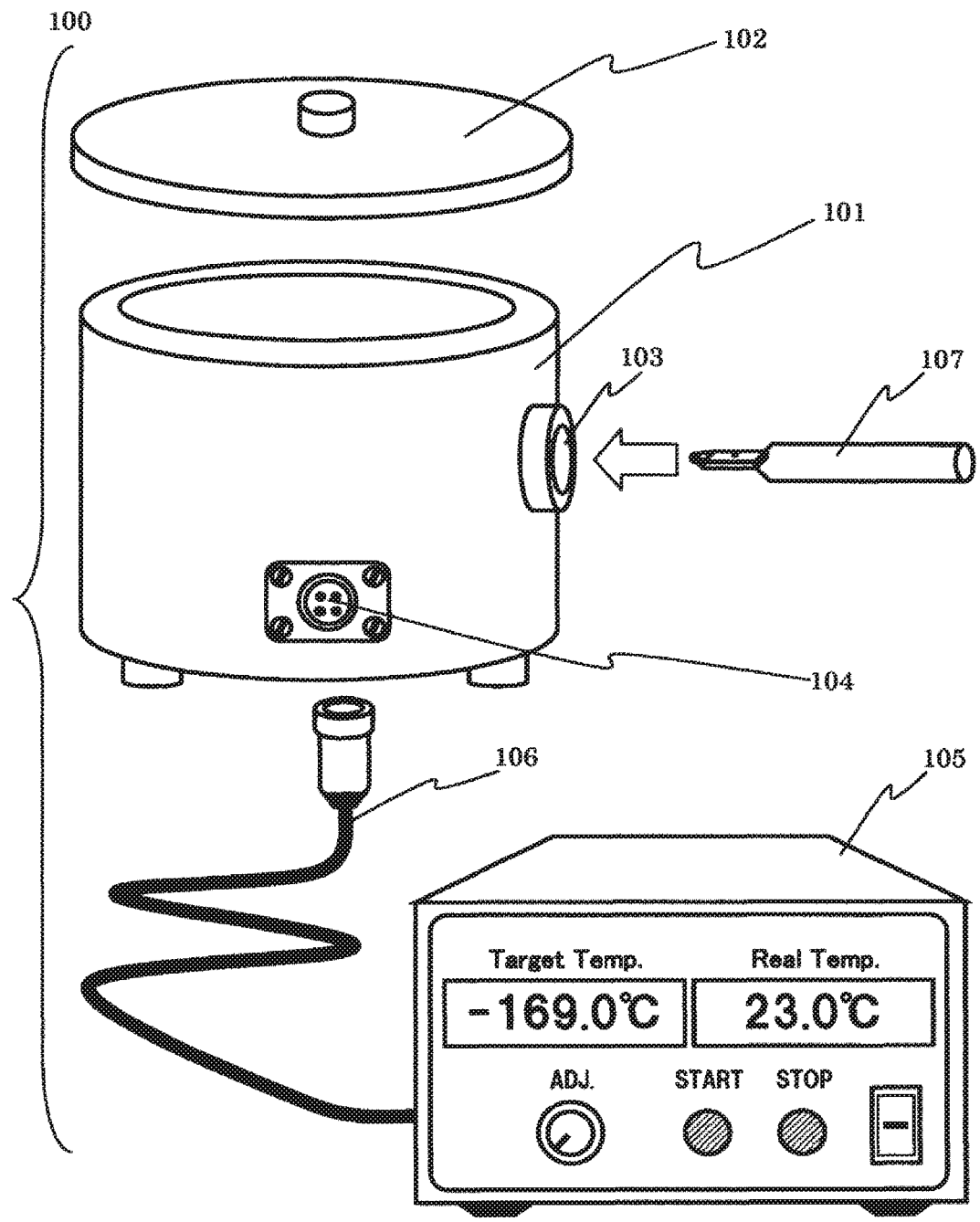

[FIG. 2]
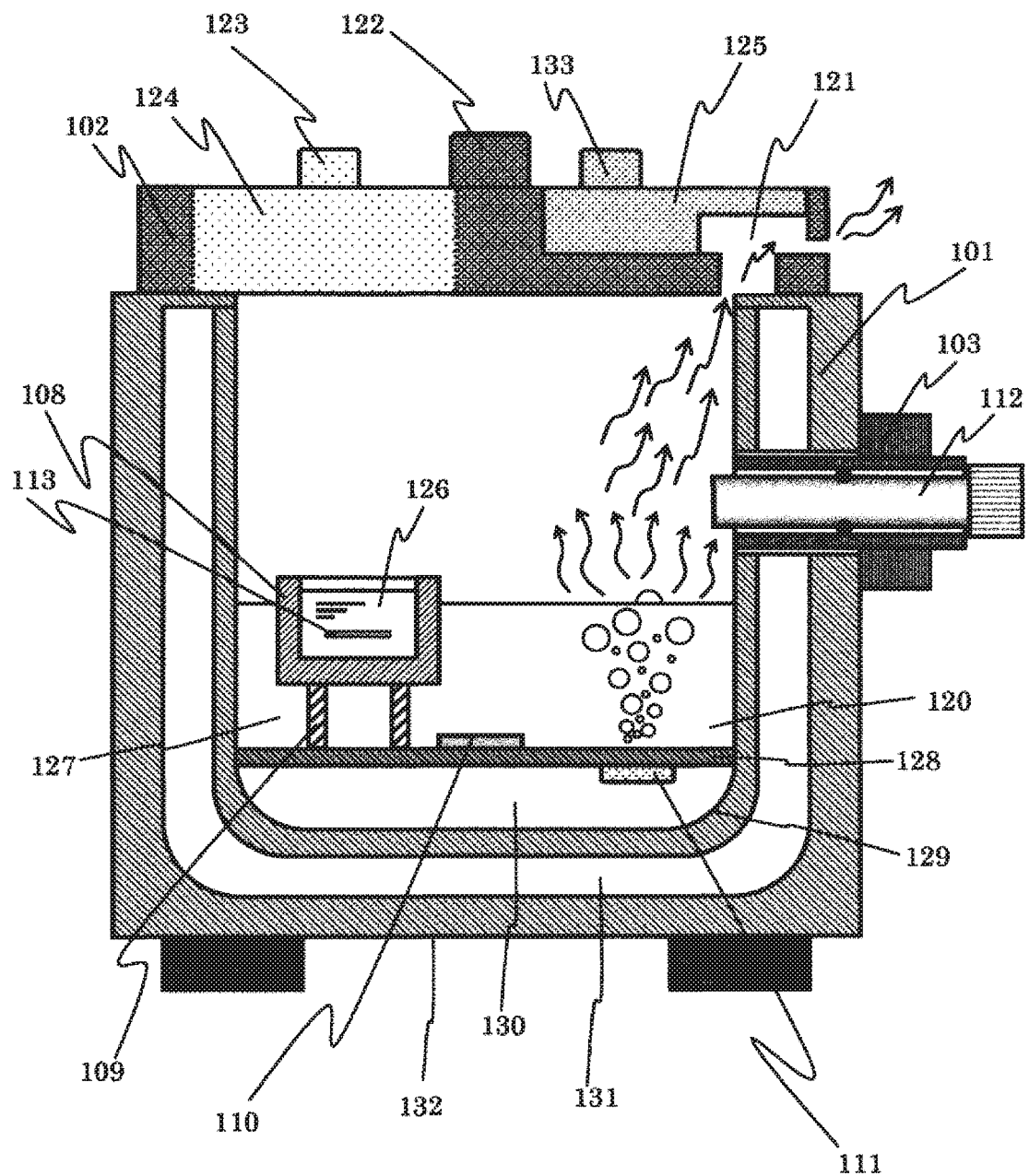

[FIG. 3]
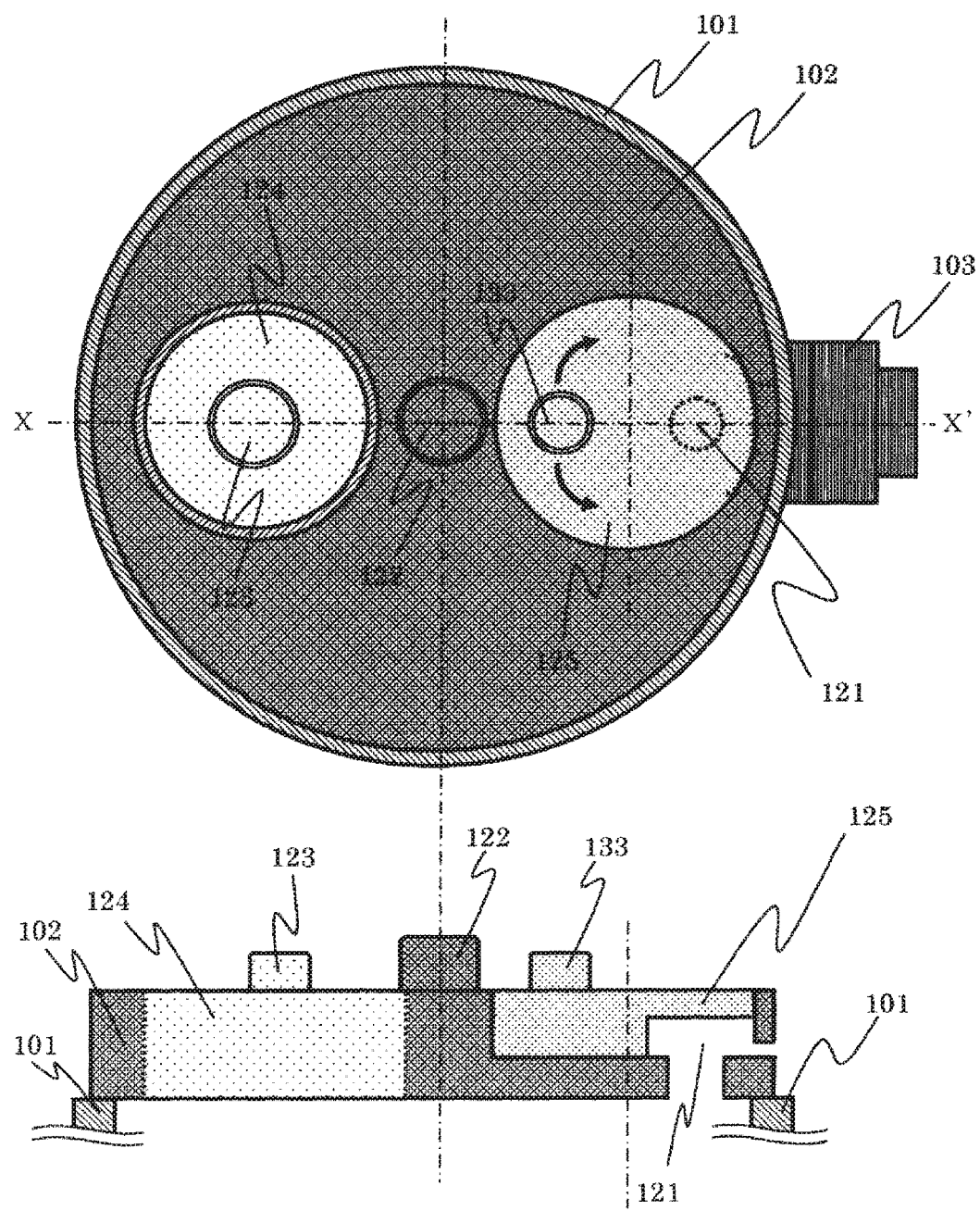

[FIG. 4]
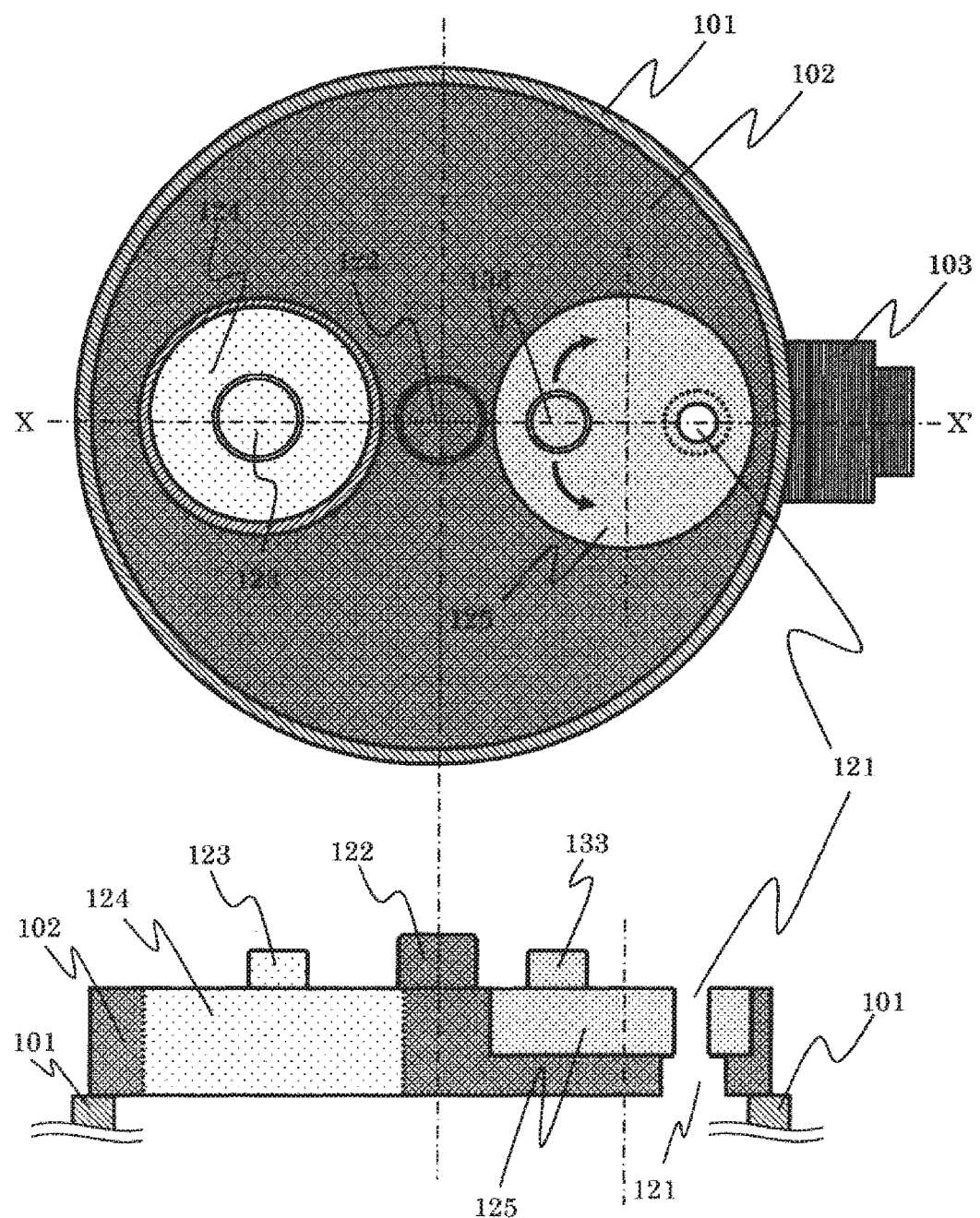

[FIG. 5A]
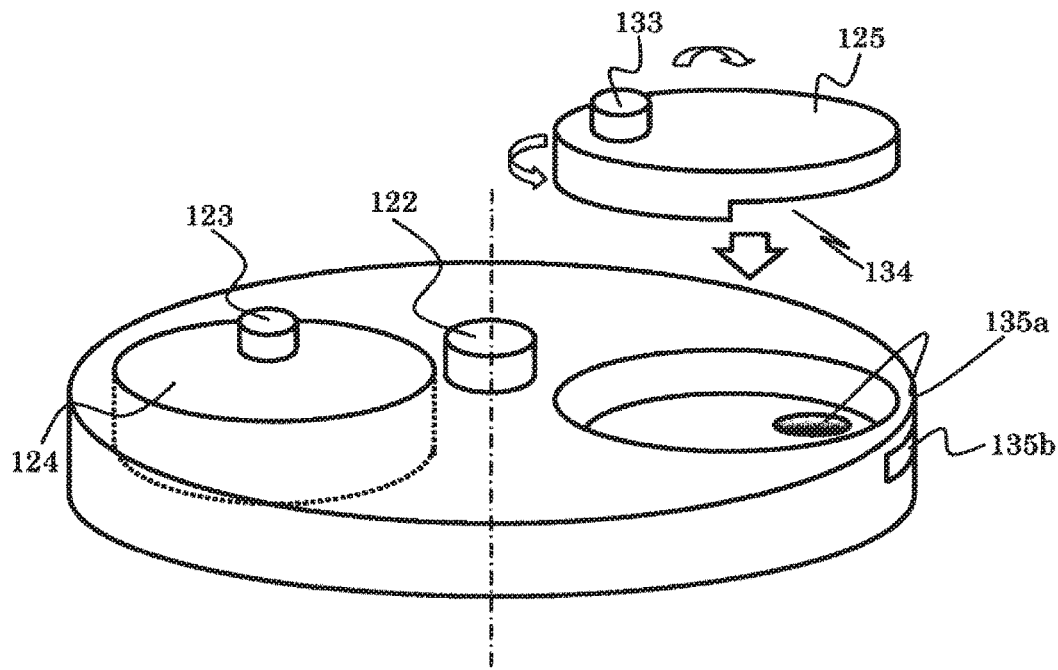
[FIG. 5B]
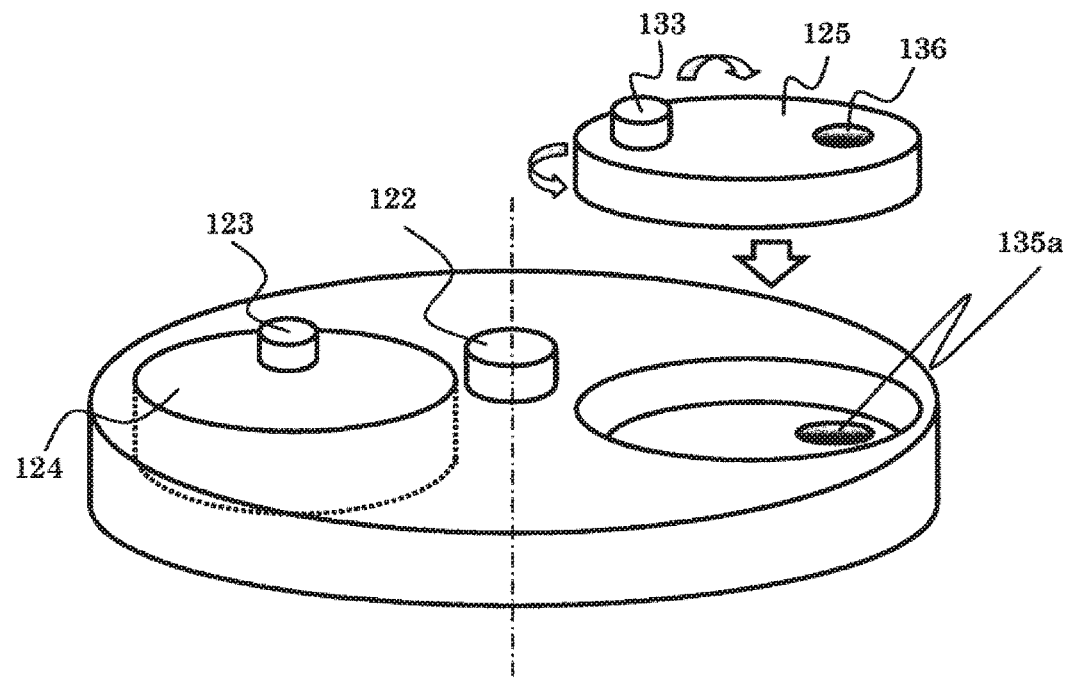

[FIG. 6]
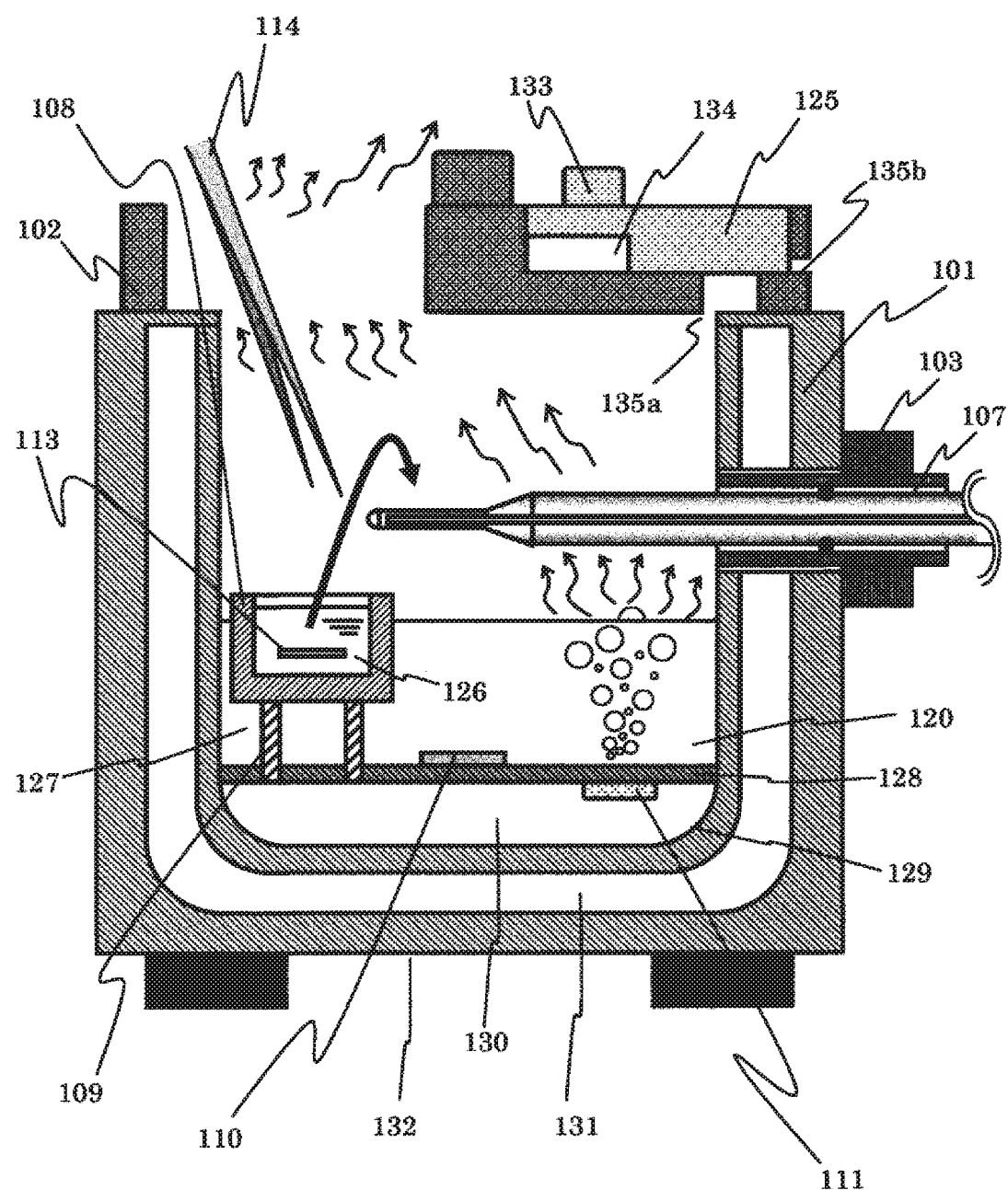

[FIG. 7]
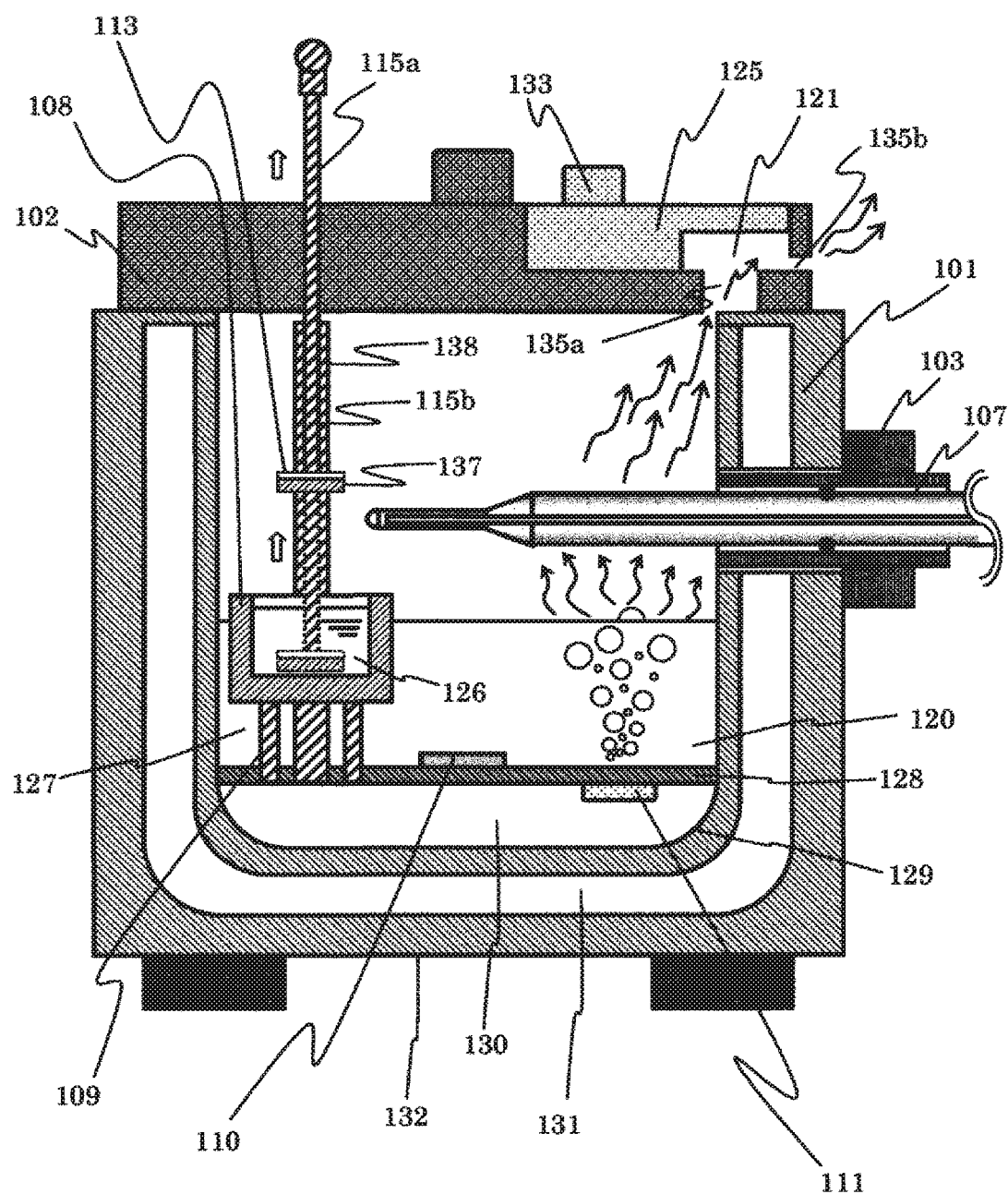

[FIG. 8]
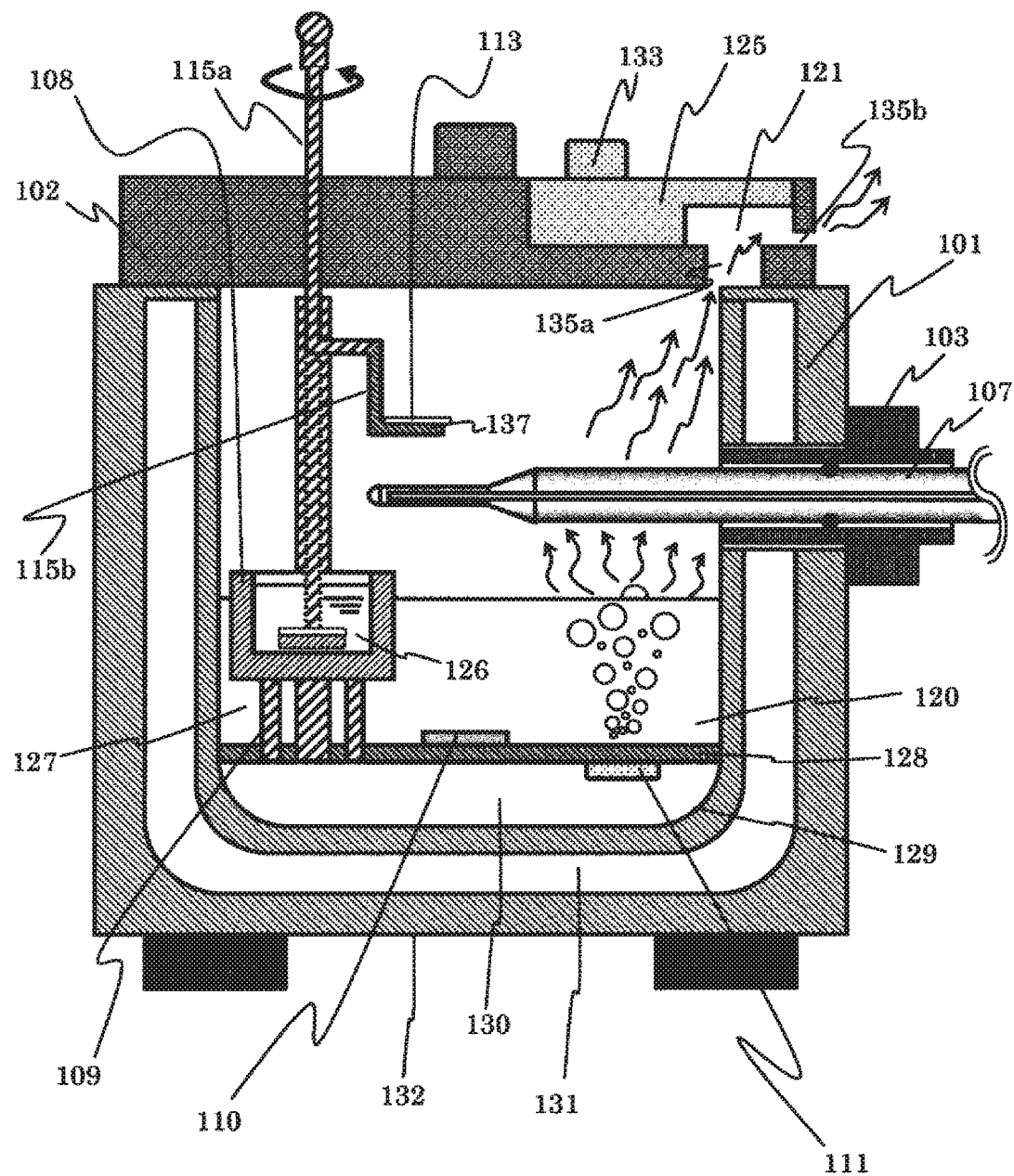

[FIG. 9]
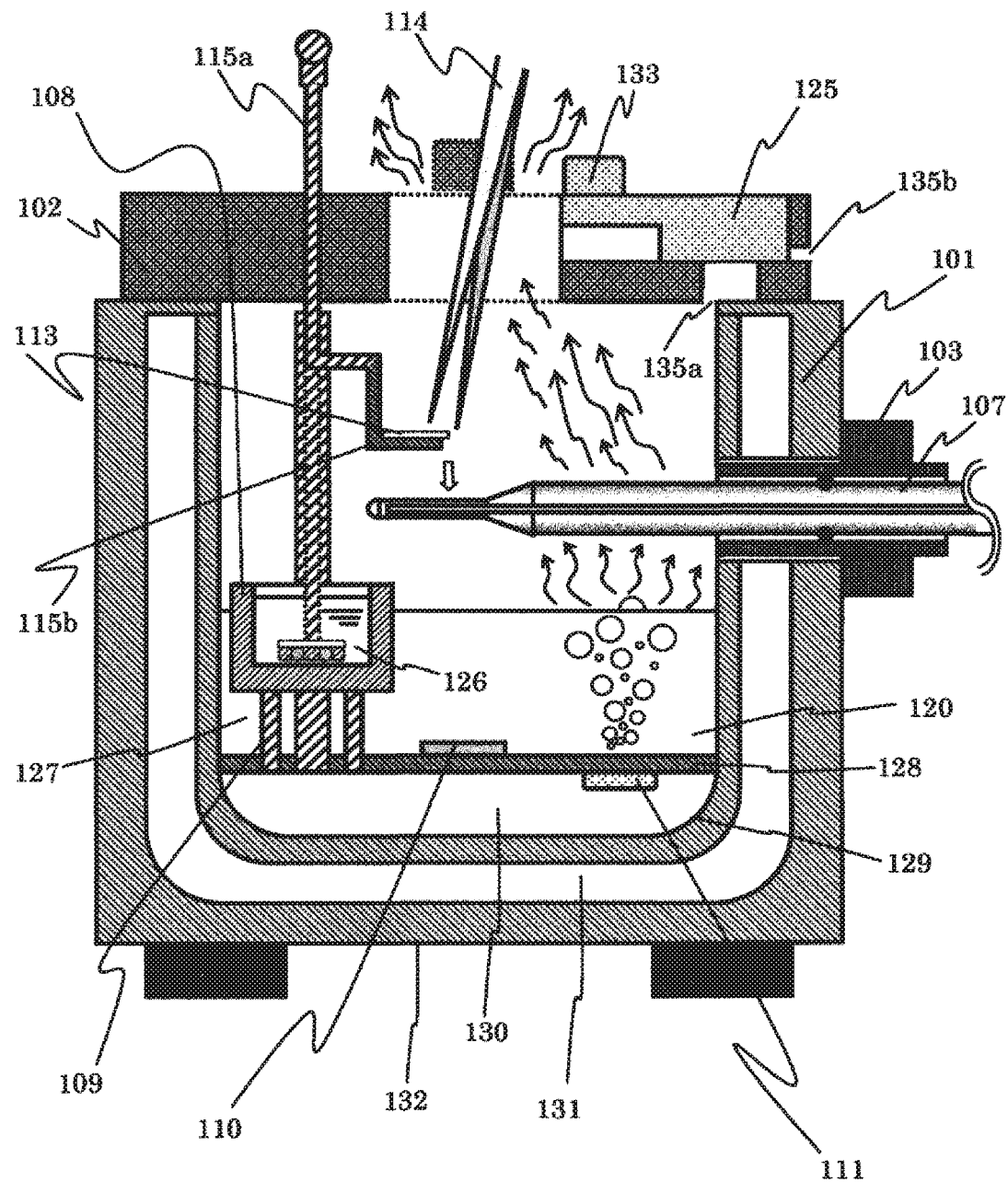

[FIG. 10]
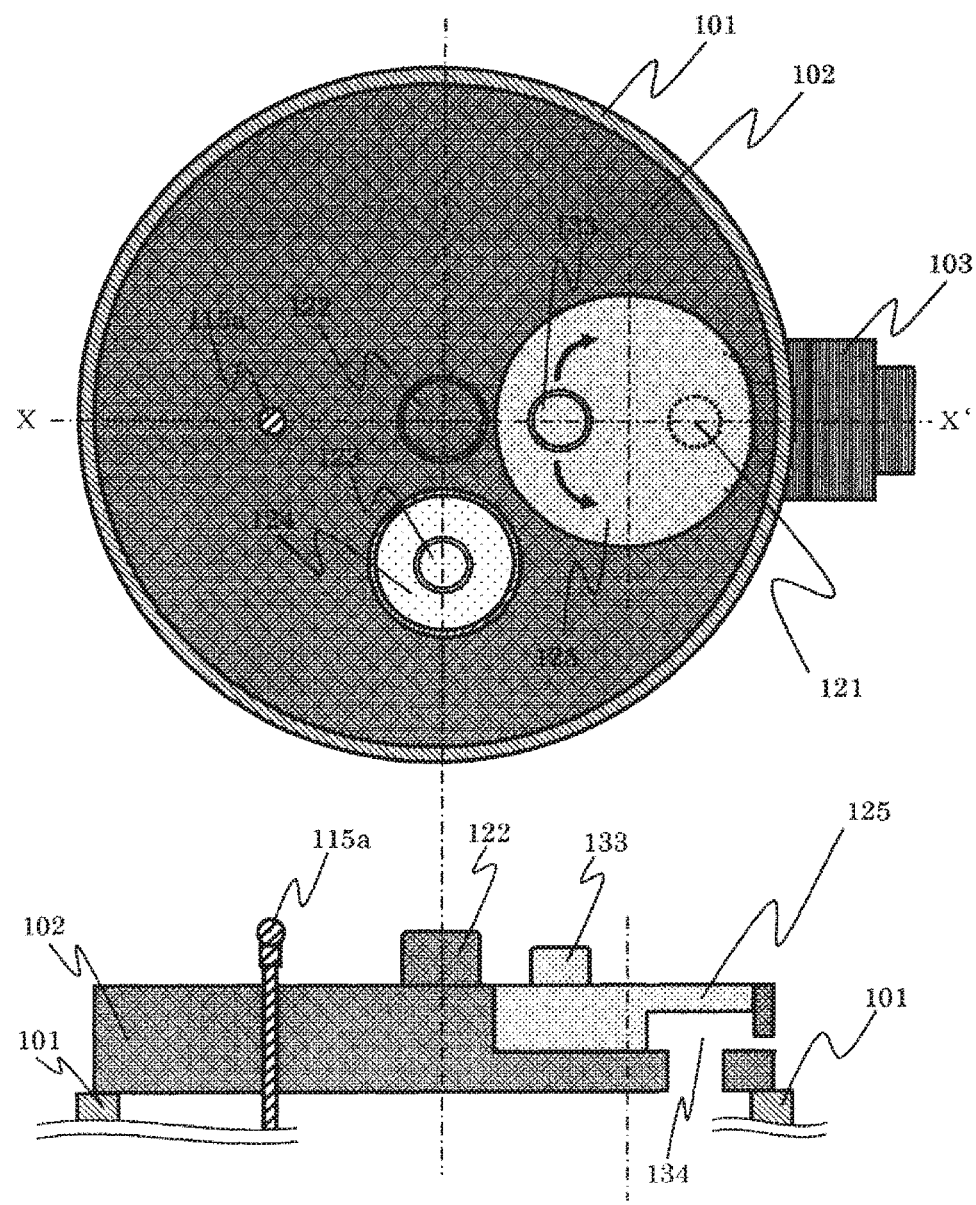

[FIG. 11]
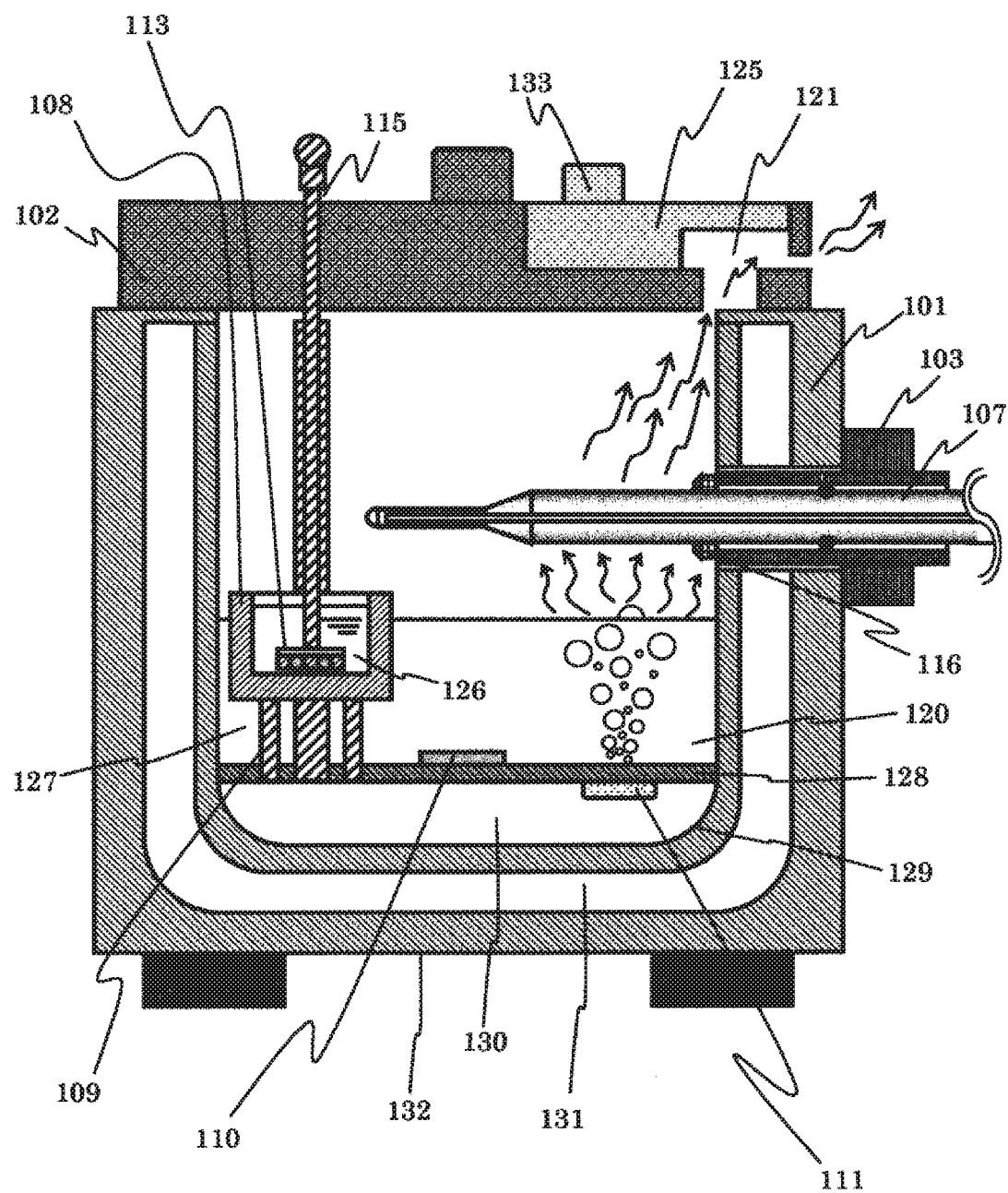

[FIG. 12]
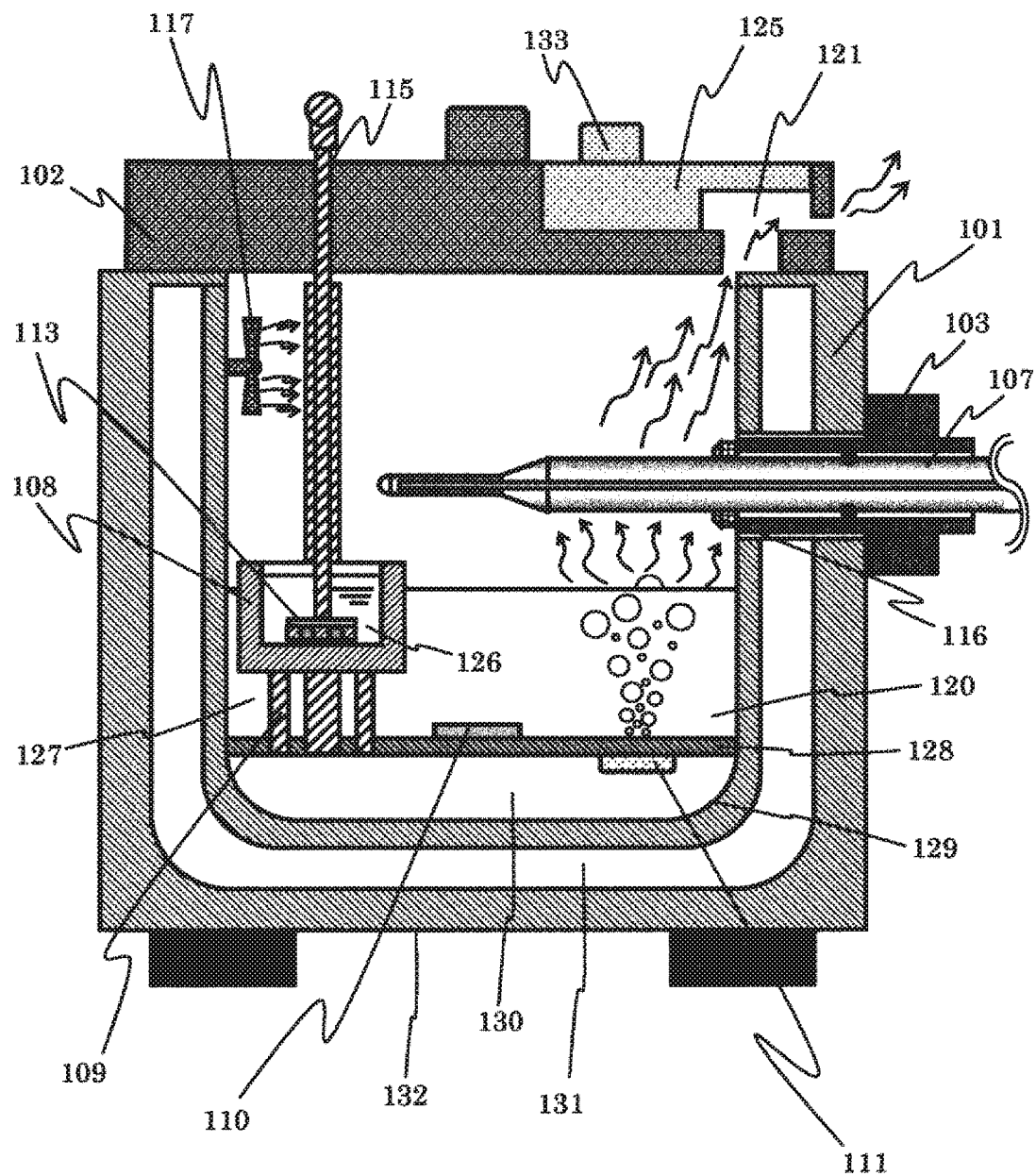

[FIG. 13]
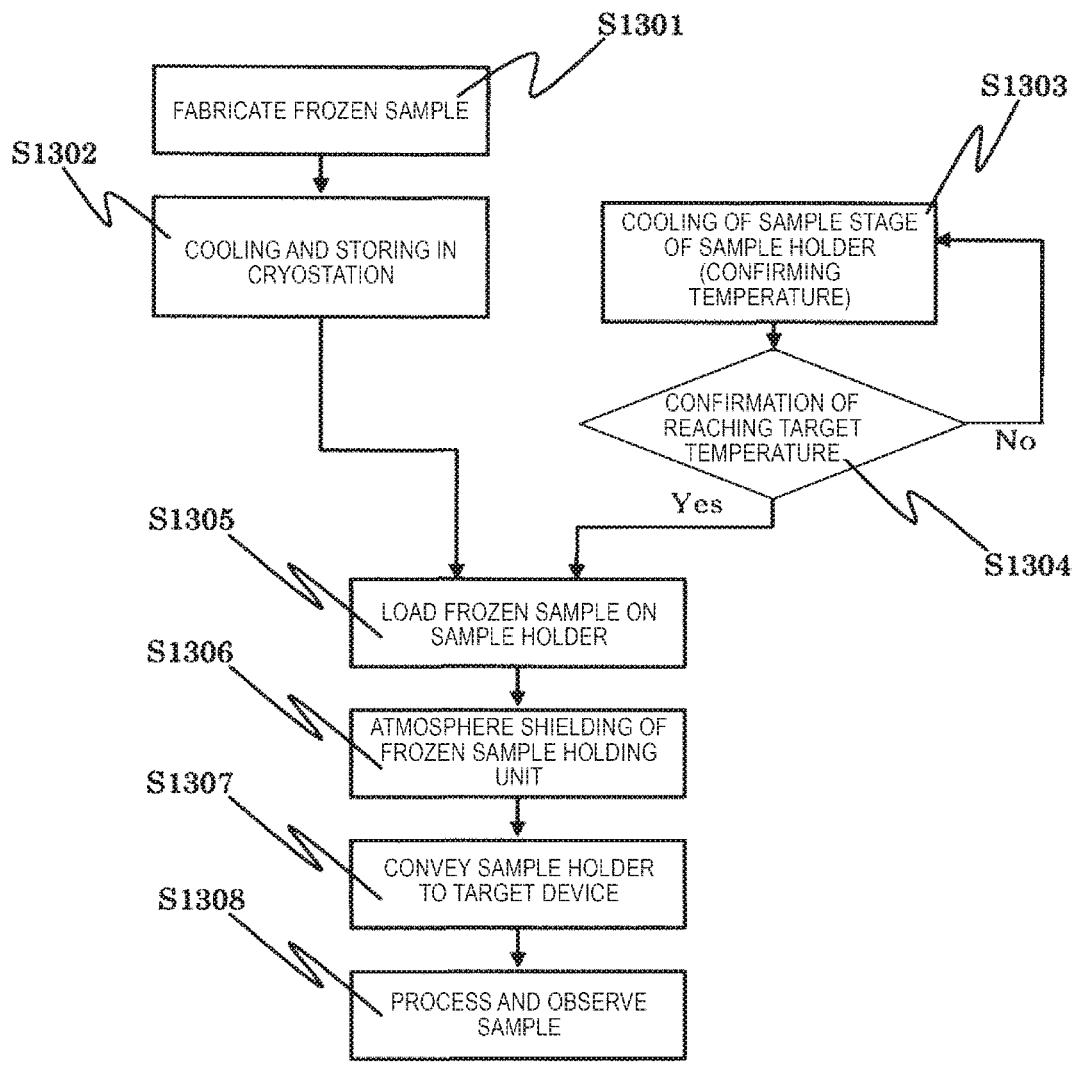

[FIG. 14]
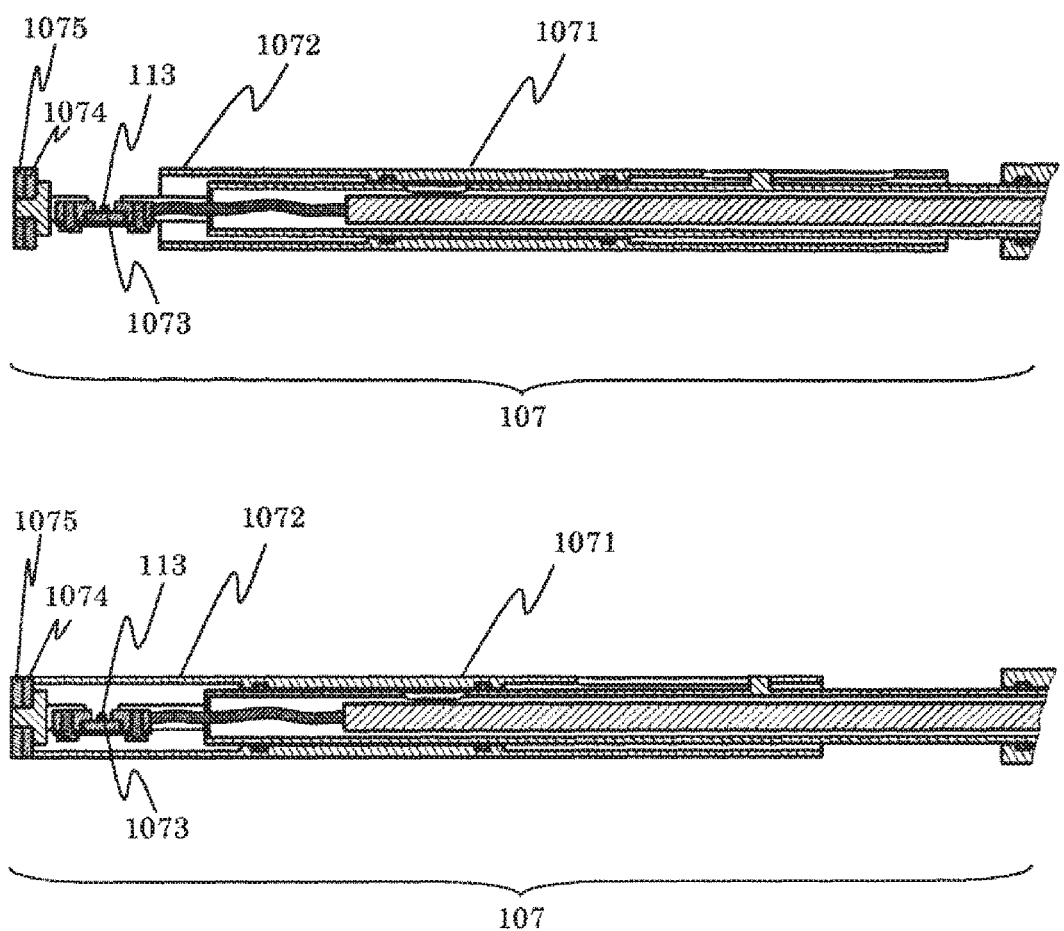

CRYOSTATION SYSTEM

TECHNICAL FIELD

The present invention relates to the treatment of a sample to be observed by a charged particle beam device, for example, an electron microscope, and particularly relates to a technique of storing and moving a cooled sample without forming condensation and frost.

BACKGROUND ART

In recent years, charged particle beam devices such as an electron microscope are used in observation and analysis of samples having fine tissue structures. In general, a sample chamber in which a sample is disposed is evacuated to make a sample atmosphere in a vacuum state in these devices.

However, in a case where most part of a sample is occupied with water such as a biological sample, the volume is contracted due to evaporation of water in the sample in the vacuum state and an internal structure may vary largely. As one of treatments for observing the fine structure of such sample as close as possible to the original state, a method of fixing the sample instantly by quick freezing.

In Patent literature 1 (JP-A-2013-88328), there is disclosed a method of fabricating an observation sample for a transmission electron microscope (TEM) by performing freeze-substitution with respect to various forms of samples such as liquid and gelatinous forms after quick freezing.

The samples subjected to treatment such as freezing (hereinafter collectively referred to merely as "cooled samples" in some cases) are introduced into a charged particle device after conveyed to a sample holder.

As a technique for effectively observing the cooled sample conveyed to the sample holder, Patent Literature 2 (JP-A-2010-257617) discloses a technique in which a shutter member shutting between a cooling mechanism and the outside is provided in the sample holder and a series of work from cooling treatment to observation of the sample is executed in one sample holder. Furthermore, in Patent Literature 3 (JP-A-2014-10965), a sample holder keeping a posture of a cooling source stably regardless of inclination of the sample is explained.

CITATION LIST

Patent Literature

Patent Literature 1: JP-A-2013-88328
Patent Literature 2: JP-A-2010-257617
Patent Literature 3: JP-A-2014-10965

SUMMARY OF INVENTION

Technical Problem

Here, when the sample touches the air at the time of conveying the cooled sample to the sample holder, condensation occurs and the sample surface is covered with frost-like substances. Such phenomenon may be a factor of preventing observation and analysis of original forms or states of samples. Accordingly, temporary storage and conveyance to the sample holder of the cooled sample may be performed in a vessel accommodating a cooling solvent, however, there is a problem that the cooling solvent is gasified and reacts with air entering inside the vessel from the outside at the time of conveyance work to the sample holder, which still forms condensation and the frost-like substances.

An object of the present invention is to provide a device and a method capable of observing and analyzing a cooled sample by a charged particle beam device while preventing the formation of condensation and frost-like substances in the cooled sample and maintaining a good frozen state at the time of conveyance to the sample holder.

Solution to Problem

According to an embodiment of the present invention, there is provided a cryostation system which stores a sample in a cooled state, including a main body for storing the sample, and a lid unit mounted on the main body, in which the main body is divided into a first space and a second space by a partition member, the first space accommodates a cooling medium for cooling the sample, the second space has, disposed therein, a heating unit for heating the cooling medium accommodated in the first space, and the lid unit has, formed therein, a discharge port for discharging a gas generated by the heating of the cooling medium to the outside.

Advantageous Effects of Invention

According to the present invention, it is possible to prevent the cooled sample from touching the air, therefore, the cooled sample can be loaded into the sample holder without forming condensation and frost-like substances and can be observed and analyzed in the charged particle beam device while keeping a good condition.

BRIEF DESCRIPTION OF DRAWINGS

FIG. 1 is a schematic configuration view of a system for storing and conveying a cooled sample according to an embodiment of the present invention.

FIG. 2 is a schematic view showing a situation where a sample is stored according to the embodiment (Example 1).

FIG. 3 shows a top view and a cross-sectional view along X-X' of a lid unit according to the embodiment (Example 1) of the present invention. (First structure example)

FIG. 4 shows a top view and a cross-sectional view along X-X' of the lid unit according to the embodiment (Example 1) of the present invention. (Second structure example)

FIG. 5A is a perspective view of the lid unit according to the embodiment (Example 1) of the present invention (First structure example).

FIG. 5B is a perspective view of the lid unit according to the embodiment (Example 1) of the present invention (Second structure example).

FIG. 6 is a schematic view showing a situation where the sample is conveyed according to the embodiment (Example 1) of the present invention.

FIG. 7 is a schematic view showing a situation where a sample is conveyed (elevating operation) according to an embodiment (Example 2) of the present invention.

FIG. 8 is a schematic view showing a situation where the sample is conveyed (rotating operation) according to the embodiment (Example 2) of the present invention.

FIG. 9 is a schematic view showing a state where the sample is conveyed (loading into the sample holder) according to the embodiment (Example 2) of the present invention.

FIG. 10 shows a top view and a cross-sectional view along X-X' of a lid unit according to the embodiment (Example 2) of the present invention (Third structure example).

FIG. 11 is a schematic view showing a state where a sample is conveyed according to an embodiment (Example 3) of the present invention.

FIG. 12 is a schematic view showing a state where a sample is conveyed according to an embodiment (Example 4) of the present invention.

FIG. 13 is a flowchart showing operations from the storage of the cooled sample to the conveyance to a charged particle beam device according to the embodiment.

FIG. 14 is a schematic configuration view of a sample holder according to the embodiment of the present invention.

DESCRIPTION OF EMBODIMENTS

Example 1

FIG. 1 shows a schematic configuration view of a system for storing and conveying a cooled sample according to an embodiment of the present invention. Hereinafter, the system for storing and conveying the cooled sample may be also referred to as a "cryostation system".

A cryostation system 100 includes a cryostation main body 101, a lid unit 102 and a temperature adjustment unit 105. The storage of the cooled sample and conveyance to the sample holder can be performed inside the cryostation main body 101.

The cryostation main body 101 is provided with an insertion opening 103 into which a sample holder 107 for holding a sample can be inserted, and a connection unit 104 connected to a cable 106 of the temperature adjustment unit 105. The temperature adjustment unit 105 includes a display unit for displaying an actual internal temperature of the cryostation main body 101 and a target cooling temperature set by a user respectively. The temperature adjustment unit 105 is connected to a later-described temperature sensor 110 and a main body heating unit 111 through not-shown wiring. The actual internal temperature is measured by the temperature sensor 110, and the measurement result is transmitted to the temperature adjustment unit 105 and displayed. Then, the main body heating unit 111 is activated by an instruction from the temperature adjustment unit 105, and temperature adjustment of a cooling solvent accommodated inside the cryostation main body 101 is performed.

Here, it is preferable that the user set a temperature (for example, −168 to −169 degrees), as a set temperature, to be slightly higher than a temperature (for example, approximately −170 degrees when using liquid nitrogen as the cooling solvent) at which the cooling solvent is accommodated inside the cryostation main body 101 in a stable state. According to the setting, the main body heating unit 111 is temporarily turned off only when the actual temperature is higher than the set temperature, and the main body heating unit 111 can be basically adjusted so as to constantly keep the on-state on other situations.

Although the example in which the temperature adjustment unit 105 and the cryostation main body 101 are connected through the cable 106 is shown in the drawing, they can be configured as an integral type.

FIG. 2 is a schematic view showing a situation where a sample is stored according to the embodiment. A space between an inner wall 129 and an outer wall 132 of the cryostation main body 101 is a vacuum space 131. Here, the vacuum space 131 may be evacuated in advance by connecting to an external vacuum pump and may be used without evacuating the space after that, or the vacuum space 131 may be evacuated each time of using.

In order to keep the vacuum insulation state inside the cryostation main body 101, a holder for vacuum sealing 112 is inserted to the insertion opening 103 instead of the sample holder 107 to be described later at the time of storing the sample.

The cryostation main body 101 is divided into a first space 127 accommodating a first cooling solvent 120 and a second cooling solvent 126 and a second space 130 not accommodating the cooling solvent by a partition member 128 as shown in the drawing.

In the first space 127, a sample storing unit 108 which holds a sample 113 is arranged. In a space other than the inside of the sample storing unit 108 in the first space 127, the first cooling solvent, for example, liquid nitrogen is accommodated. The second cooling solvent, for example, liquid ethane is accommodated inside the sample storing unit 108. In this case, a solvent with a higher boiling point than the first cooling solvent is preferably used as the second cooling solvent. According to the structure, the second cooling solvent existing inside the sample storing unit 108 is constantly cooled by the first cooling solvent existing in the space other than the inside of the sample storing unit 108, therefore, the second cooling solvent is not gasified and held in the liquid state, and the cooling state of the sample at the time of storing can be maintained.

However, the present invention is not limited to the above conditions, and the first cooling solvent and the second cooling solvent can be the same substance.

The sample storing unit 108 is fixed by a sample storing unit stand 109. The sample 113 is stored in a state of being dipped in the second cooling solvent 126 inside the sample storing unit 108.

A material with a higher heat conduction, for example, a metal substance such as silver or copper is used for the sample storing unit 108, and a material with a lower heat conduction than the sample storing unit 108, for example, resin or the like is used for the sample storing unit stand 109. This is determined in consideration of heat conduction by the later-described main body heating unit 111.

Here, the cryostation main body 101 is provided with the main body heating unit 111 in the second space 130 formed by the partition member 128 and the inner wall 129 for heating the internal first cooling solvent 120.

The main body heating unit 111 actively gasifies the first cooling solvent 120 by heating, discharging the vapor to the outside. The vapor of the first cooling solvent 120 is discharged from an exhaust port 121 provided in the lid unit 102, which inhibits entry of air or water vapor from the outside. Accordingly, formation of condensation and the frost-like substances inside the cryostation main body 101 is prevented. In this case, the setting position of the main body heating unit 111 is preferably a position near one end side (an end opposite to the sample storing unit 108) on an undersurface of the partition member 128 (second space 130 side), and a position corresponding to a part under the exhaust port 121. According to the structure, it is possible to actively discharge the vapor from the exhaust port 121. However, the main body heating unit 111 may be arranged at positions other than the above position.

Furthermore, the temperature sensor 110 is provided in an upper surface (the first space 127 side) of the partition member 128 of the cryostation main body 101 in the drawing, thereby measuring the temperature of the cryostation main body 101 and transmitting information of the actual internal temperature to the temperature adjustment unit 105 to perform feedback.

The lid unit 102 includes a lid unit knob 122, an operation window 124 and an exhaust port opening/closing unit 125.

The operation window 124 has an operation window knob 123. The exhaust port opening/closing unit 125 forms a step (or a hole) to be the exhaust port at a part thereof, which can open and close the exhaust port by moving a knob 133 as described later.

FIG. 3 shows a top view and a cross-sectional view along X-X' in the drawing (a first structure example) obtained when the lid unit 102 is set on the cryostation main body 101. The lid unit 102 includes the operation window 124 used when the sample 113 is loaded into the sample holder 107 and the exhaust port opening/closing unit 125. As the exhaust port opening/closing unit 125 has a step as shown in the X-X' cross-sectional view, the exhaust port 121 for vapor generated inside the cryostation main body 101 is formed by moving the knob 133 in any of directions of arrows in the top view. The operation window 124 has a detachable structure, and is used in a state of being detached by using the operation window know 123 when the sample 113 is loaded into the sample holder 107. The operation window 124 is preferably formed of materials such as transparent resin so as to confirm the contents easily even when the operation window 124 is attached to the cryostation main body 101.

FIG. 4 shows a top view and a cross-sectional view along X-X' in the drawing (a second structure example) obtained when the lid unit 102 is set on the cryostation main body 101. In the drawing, the exhaust port opening/closing unit 125 has a hole instead of the stepped shape shown in FIG. 3. Accordingly, the exhaust port 121 for vapor generated inside the cryostation main body 101 is formed by moving the knob 133 in any of directions of arrows in the top view.

FIG. 5A shows a perspective view of the lid unit (the first structure example) according to the embodiment of the present invention. The drawing corresponds to the structure of the lid unit 102 explained in FIG. 3. As shown in the drawing, the exhaust port opening/closing unit 125 is provided with a step 134, which rotates by moving the knob 133 in any of directions of arrows in the drawing. When an opening 135a formed in the lid unit 102 and a portion where the step 134 is formed are in an overlapping positional relationship by the rotation, the vapor generated inside the cryostation main body 101 is exhausted from the opening 135a and an opening 135b provided on a side surface of the lid unit 102.

FIG. 5B shows a perspective view of the lid unit (the second structure example) according to the embodiment of the present invention. The drawing corresponds to the structure of the lid unit 102 explained in FIG. 4. As shown in the drawing, the exhaust port opening/closing unit 125 is provided with an opening 136, which rotates by moving the knob 133 in any of directions of arrows in the drawing. When the opening 135a formed in the lid unit 102 and the opening 136 are in an overlapping positional relationship by the rotation, the vapor generated inside the cryostation main body 101 is exhausted from an exhaust port formed by the openings 135a and 136 overlapping with each other.

Although the case where the structure of the lid unit 102 shown in FIG. 5A is used is described in the following explanation, the explanation can be adopted for any of structures of FIG. 5A and FIG. 5B.

FIG. 6 shows a schematic view showing a situation where a sample is conveyed according to the embodiment of the present invention. In the first space 127 inside the cryosta-tion main body 101, the first cooling solvent, for example, liquid nitrogen is accommodated in a space other than the inside of the sample storing unit 108 in the same manner as the situation of storing the sample. In the sample storing unit 108, the second cooling solvent, for example, liquid ethane cooling solvent is accommodated. In this case, a solvent with a higher boiling point than the first cooling solvent existing around the sample storing unit 108 is preferably used as the second cooling solvent accommodated inside the sample storing unit 108. According to the structure, the second cooling solvent existing inside the sample storing unit 108 is cooled by the first cooling solvent existing in the space other than the inside of the sample storing unit 108, therefore, the second cooling solvent is not gasified and held in the liquid state as described above. However, the boiling points of both cooling solvents may be the same, and the same substance can be used as these solvents.

The operation window 124 is removed, an instrument such as tweezers 114 is inserted from an opening formed in a part of the lid unit 102 to thereby hold the cooled sample 113 stored in the sample storing unit 108 and convey the sample 113 to the sample holder 107 existing in a direction of an arrow in the drawing. The sample 113 can be loaded on a not-shown sample stage of the sample holder 107. Here, the sample holder 107 is inserted from the insertion opening 103 instead of the holder for vacuum sealing 112 shown in FIG. 2. In this case, it is preferable that instruments such as tweezers 114 used for the work are previously cooled so as to prevent temperature increase of the sample 113. While the sample 113 is conveyed to the sample holder 107, the gasified first cooling solvent 120 is positively discharged from the opening formed by removing the operation window 124. In this case, the step 134 provided in the exhaust port opening/closing unit 125 is arranged so as not to overlap with the opening 135a of the lid unit 102. According to the structure, the temperature of the first cooling solvent 120 inside the cryostation main body 101 is adjusted by the main body heating unit 111, positively gasified and discharged only from one place, therefore, invasion of gas from the outside can be prevented as well as adhesion of frost to the sample and the inside of the cryostation main body 101 can be prevented.

Example 2

In Example 1, the case where the conveyance of the sample 113 to the sample holder 107 is performed by using the instrument such as the tweezers 114 through the opening in the lid unit 102 has been explained.

In the present example, a structure for conveying the sample 113 to the sample holder 107 more easily by using a sample conveyance mechanism 115 provided in the cryostation main body 101 will be explained.

FIG. 7 is a schematic view showing a situation where the sample is conveyed according to the embodiment. Here, the cryostation main body 101 includes the sample conveyance mechanism 115 for loading the sample 113 cooled and stored in the sample storing unit 108 into the sample holder 107 more easily.

The sample conveyance mechanism 115 penetrates through a through hole provided in the lid unit 102 to be installed inside the cryostation main body 101. A portion exposed to the outside from the lid unit 102 functions as an operation handle used at the time of conveying the sample. In this case, the through hole in the lid unit 102 has a structure in which the periphery of the sample conveyance mechanism 115 is atmosphere-shielded by using a not-shown O-ring, a packing and so on to thereby prevent invasion of air from the outside.

A portion 115b penetrating through the lid unit 102 and accommodated in the cryostation main body 101 in the sample conveyance mechanism 115 preferably uses a material with a high heat conduction, for example, a metal such as copper, and a portion 115a exposed to the air in the outside of the lid unit 102 preferably uses a material with a low heat conduction, for example, a resin and so on.

The sample 113 inside the sample storing unit 108 is held by a sample holding unit 137 positioned in the lower end of the sample conveyance mechanism 115 in the drawing and is moved to the upper direction in the drawing by operating the handle. As shown in the drawing, elevating operation of the sample conveyance mechanism 115 is possible in a state of holding the sample 113, and has, for example, a shaft-like shape. The sample holding unit 137 has a flat plate shape. In order to support the operation of the sample conveyance mechanism 115, it is possible to provide a bearing member 138 to thereby prevent axis deviation. The bearing member 138 can be formed with various lengths and widths in addition to the shape shown in the drawing.

FIG. 8 shows a situation where the sample 113 moved upward by the elevating operation in FIG. 7 is moved to the vicinity of the sample stage of the sample holder 107 by rotating the handle of the sample conveyance mechanism 115 in a direction of an arrow in the drawing. As shown in the drawing, the vicinity of the sample holding unit 137 of the sample conveyance mechanism 115 has a stepped shape.

In this case, the opening 135a formed in the lid unit 102 and a portion where the step 134 is formed in the exhaust port opening/closing unit 125 are formed to have an overlapping positional relationship. According to the structure, the vapor generated inside the cryostation main body 101 is positively exhausted from the opening 135a and the exhaust port 121 formed by the opening 135b provided in the side surface of the lid unit 102, which can prevent invasion of air and so on from the outside. Therefore, it is possible to prevent the formation of condensation and frost-like substances in the sample and the inside of the cryostation main body 101.

FIG. 9 shows a situation where the sample 113 moved to the vicinity of the sample stage of the sample holder 107 by the rotating operation in FIG. 8 is loaded on the sample stage by using the instrument such as the tweezers 114. The operation window 124 is removed, the instrument such as the tweezers 114 is inserted from the opening formed in the lid unit 102 to load the sample 113 on the sample stage of the sample holder 107.

At this time, the opening 135a formed on the lid unit 102 side and the portion where the step 134 of the exhaust port opening/closing unit 125 is provided have a positional relationship in which they do not overlap each other. According to the structure, the above-described vapor is positively discharged only from the opening for operation in the lid unit 102.

FIG. 10 shows a top view and a cross-sectional view along X-X' in the drawing (a third structure example) obtained when the lid unit 102 is set on the cryostation main body 101.

The lid unit 102 includes a not-shown through hole in addition to the operation window 124 used when the sample 113 is loaded into the sample holder 107 and the exhaust port opening/closing unit 125. The sample conveyance mechanism 115 is introduced into the cryostation main body 101 via the through hole. Here, the arrangement of the operation window 124 is not limited to the structure shown in the drawing.

As the exhaust port opening/closing unit 125 has the step 134 as shown in the X-X' cross-sectional view, the exhaust port 121 for the vapor generated inside the cryostation main body 101 is formed by moving the knob 133 in any of directions of arrows in the top view. The operation window 124 has a detachable structure, and is used in a state of being detached by using the operation window know 123 when the sample 113 is loaded into the sample holder 107. The operation window 124 is preferably formed of materials such as transparent resin so as to confirm the contents easily even when the operation window 124 is attached to the cryostation main body 101.

Example 3

In the example, a structure in which the formation of condensation and frost-like substances in the sample holder 107 is prevented more effectively will be explained.

FIG. 11 is a view showing a situation where the sample 113 is moved according to the embodiment. A sample holder heating unit 116 for transmitting heat to the sample holder 107 is provided inside the insertion opening 103 of the cryostation main body 101. According to the structure, the condensation in the sample holder 107 is prevented when the first cooling solvent 120 is gasified and moves upward in the direction of the exhaust port 121.

Example 4

In the embodiment, a situation where the gasified first cooling solvent 120 is forcibly exhausted will be explained.

FIG. 12 is a view showing a situation where the sample 113 is moved according to the embodiment. The cryostation main body 101 is provided with an exhaust mechanism 117 for forcibly exhausting the gasified first cooling solvent 120. As the exhaust mechanism 117, a fan or the like is used. Accordingly, the gasified first cooling solvent 120 is forcibly exhausted from the exhaust port 121 provided in the lid unit 2.

Accordingly, invasion of air or water vapor from the outside can be suppressed and the formation of condensation and frost-like substances in the sample 113 can be prevented.

FIG. 13 is a flowchart showing operations from the storage of the cooled sample to the conveyance to the charged particle beam device according to the embodiment. First, treatment such as freezing and drying is applied to the sample to fabricate a cooled sample (S1301), and the sample is stored in the sample storing unit 108 in the cryostation main body 101 in a frozen state (S1302). The sample holder 107 is inserted from the insertion opening 103 and cooled to a target temperature while confirming the temperature of a portion of the sample stage on which the sample is loaded (S1303, S1304).

The frozen sample 113 is moved to the sample holder 107 and loaded on the sample stage by the above method (S1305).

After that, the portion of the sample holder 107 where the sample is loaded is covered with a shutter member or the like before the sample holder 107 is taken to the outside, namely, to the air from the insertion opening 103 of the cryostation main body 101, so that the sample is not exposed to the air (S1306). Here, atmosphere shielding of the sample using the structure of the sample holder 107 suitable to the embodiment will be explained. FIG. 14 is a configuration example of the sample holder according to the embodiment, showing a state where the shutter is not used and a state where the shutter is used. The sample holder 107 includes a sample holder main body 1071, a shutter member 1072, a sample stage 1703, a tip-end shield 1074 and a tip-end shield presser 1075. The sample 113 is loaded on the sample stage 1073.

While the sample holder 107 is arranged inside the cryostation system main body 101 and the conveyance work of the sample is performed, the shutter member 1072 is not used and the sample 113 is in the exposed state as shown in the upper drawing.

On the other hand, when the sample holder 107 is exposed to the air after the sample 113 is loaded on the sample stage, the shutter member 1072 is pulled out to the tip-end shield 1074 and the sample 113 is placed as shown in the lower drawing. According to the procedure, the sample 113 is not exposed to the air while the sample 113 taken out from the cryostation system is conveyed to the sample stage of the charged particle beam device, therefore, the vacuum state can be maintained and the formation of the condensation and frost-like substances can be prevented.

Return to FIG. 13. Next, the sample holder 107 is taken out from the insertion opening 103 and conveyed to the target charged particle beam device such as the electron microscope (S1307).

After the sample holder 107 is introduced into the charged particle beam device, the sample is processed and observed (S1308).

According to the embodiment, the formation of condensation and frost-like substances with respect to the sample subjected to freezing treatment and so on can be prevented, and observation and analysis by the charged particle beam device can be performed while maintaining good frozen state.

The present invention is not limited to the above embodiments and naturally includes various modification examples.

REFERENCE SIGNS LIST 101 crystation main body
102 lid unit
103 insertion opening
104 connection unit
105 temperature adjustment unit
106 cable
107 sample holder
108 sample storing unit
109 sample storing unit stand
110 temperature sensor
111 main body heating unit
112 holder for vacuum sealing
113 sample
114 tweezers
115a, b sample conveyance mechanism
116 sample holder heating unit
117 exhaust mechanism
118 fabrication of cooled sample
119 cooling and storing in cryostation
120 cooling solvent
121 exhaust port
122 lid unit knob
123 operation window knob
124 operation window
125 exhaust port opening/closing unit
126 second cooling solvent
127 first space
128 partition member
129 inner wall
130 second space
131 vacuum space
132 outer wall
133 knob
134 step
135a, b opening (lid unit's side)
136 opening (exhaust port opening/closing unit's side)
137 sample holding unit
1071 sample holder main body
1072 shutter member
1073 sample stage
1074 tip-end shield
1075 tip-end shield presser

The invention claimed is:

1. A cryostation system which stores a sample in a cooled state, comprising:
a main body for storing the sample; and
a lid unit mounted on the main body,
wherein the main body has an insertion opening from which a sample holder for introducing a sample is inserted from the outside,
wherein the insertion opening is formed at a side surface of the main body,
wherein the main body has an inner wall and an outer wall, having a vacuum space between the inner and outer wall of the main body,
wherein the main body is divided into a first space and a second space, divided by a partition member, and a sample storing unit,
wherein the main body has a sample conveyance mechanism for conveying the sample to the sample holder inserted from the insertion opening while the sample and sample holder remain below the lid unit,
wherein the first space accommodates a first cooling medium for cooling a second cooling medium and the sample,
wherein the second space has, disposed therein, a heating unit for heating the first cooling medium accommodated in the first space,
wherein the sample storing unit contains the second cooling medium for cooling the sample, which second cooling medium may be the same or different from the first cooling medium,
wherein the second cooling medium is not gasified, and
wherein the first cooling medium contacts the sample storing unit in a liquid state, and
the lid unit has, formed therein, a discharge port for discharging a gas generated by the heating of the cooling medium from inside the cryostation system to outside the cryostation system.

2. The cryostation system according to claim 1, wherein the lid unit forms the discharge port by providing a step in a part of a surface mounted on the main body.

3. The cryostation system according to claim 1, wherein the heating unit is arranged in the second space and in the vicinity on one end side of the partition member.

4. The cryostation system according to claim 3, wherein the sample is arranged in the first space and in the vicinity on the other end side of the partition member.

5. The cryostation system according to claim 3, wherein the lid unit forms the discharge port at a position corresponding to an upper part of the heating unit provided in the main body.

6. The cryostation system according to claim 1, wherein the sample conveyance mechanism contains a shaft member for rotating the sample and moving the sample upward and downward.

7. The cryostation system according to claim 1, further comprising:
a sample holder heating unit for heating the sample holder inserted from the insertion opening inside the main body and in a periphery of the insertion opening.

8. The cryostation system according to claim 1, further comprising:
an exhaust mechanism inside the main body,
wherein the exhaust mechanism sends air so that the gas generated by the heating of the cooling medium is discharged from the discharge port.

9. The cryostation system according to claim 1, wherein the second cooling medium for the sample storing unit has a higher boiling point than the first cooling medium.

\* \* \* \* \*